United States Patent
Goodman et al.

[11] Patent Number: 6,057,182
[45] Date of Patent: *May 2, 2000

[54] HYDROGENATION OF POLYSILICON THIN FILM TRANSISTORS

[75] Inventors: Lawrence Alan Goodman, Plainsboro; Grzegorz Kaganowicz, Bellmead; Lawrence Keith White, Princeton Junction; Harry Louis Pinch; Ronald Keith Smeltzer, both of Princeton, all of N.J.

[73] Assignee: Sarnoff Corporation, Princeton, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/924,799

[22] Filed: Sep. 5, 1997

[51] Int. Cl.$^7$ ................................................. H01L 21/336
[52] U.S. Cl. .................................... 438/162; 438/475
[58] Field of Search .................... 438/162, 475, 438/FOR 448

[56] References Cited

U.S. PATENT DOCUMENTS

| | | | |
|---|---|---|---|
| 4,605,447 | 8/1986 | Brotherton et al. | 438/475 |
| 4,943,837 | 7/1990 | Konishi et al. | 438/162 |
| 5,250,444 | 10/1993 | Khan et al. | 438/162 |
| 5,401,685 | 3/1995 | Ha | 438/162 |
| 5,470,763 | 11/1995 | Hamada | 438/162 |
| 5,534,445 | 7/1996 | Tran et al. | 438/162 |
| 5,541,119 | 7/1996 | Kodama | 438/475 |
| 5,674,759 | 10/1997 | Jung | 438/162 |
| 5,686,335 | 11/1997 | Wuu et al. | 438/154 |
| 5,693,961 | 12/1997 | Hamada | 257/66 |
| 5,719,076 | 2/1998 | Guha | 438/96 |
| 5,744,202 | 4/1998 | Nickel | 427/527 |
| 5,759,745 | 6/1998 | Hollingsworth | 430/313 |

FOREIGN PATENT DOCUMENTS

| | | | |
|---|---|---|---|
| 60-16462 | 1/1985 | Japan | 438/FOR 448 |
| 1-45172 | 2/1989 | Japan | 438/FOR 448 |
| 2-14568 | 1/1990 | Japan | 438/FOR 448 |
| 2-7420 | 1/1990 | Japan | 438/FOR 448 |
| 2-43772 | 2/1990 | Japan | 438/FOR 448 |
| 2-187037 | 7/1990 | Japan | 438/FOR 448 |
| 3-289139 | 12/1991 | Japan | 438/FOR 448 |
| 4-150036 | 5/1992 | Japan | 438/FOR 448 |
| 6-37113 | 2/1994 | Japan | 438/FOR 448 |

*Primary Examiner*—Mary Wilczewski
*Attorney, Agent, or Firm*—William J. Burke

[57] ABSTRACT

A method of making a liquid crystal display which has a layer of polysilicon on a surface of a substrate, a gate of a conductive material over and insulated from a portion of the polysilicon layer, a layer of an insulating material over the gate, and a metal layer on the insulating layer. The method includes forming a layer of an insulating material over the metal layer and then subjecting the device to a plasma containing hydrogen to diffuse the hydrogen through the insulating layers and the metal layer into the polysilicon layer.

13 Claims, 1 Drawing Sheet

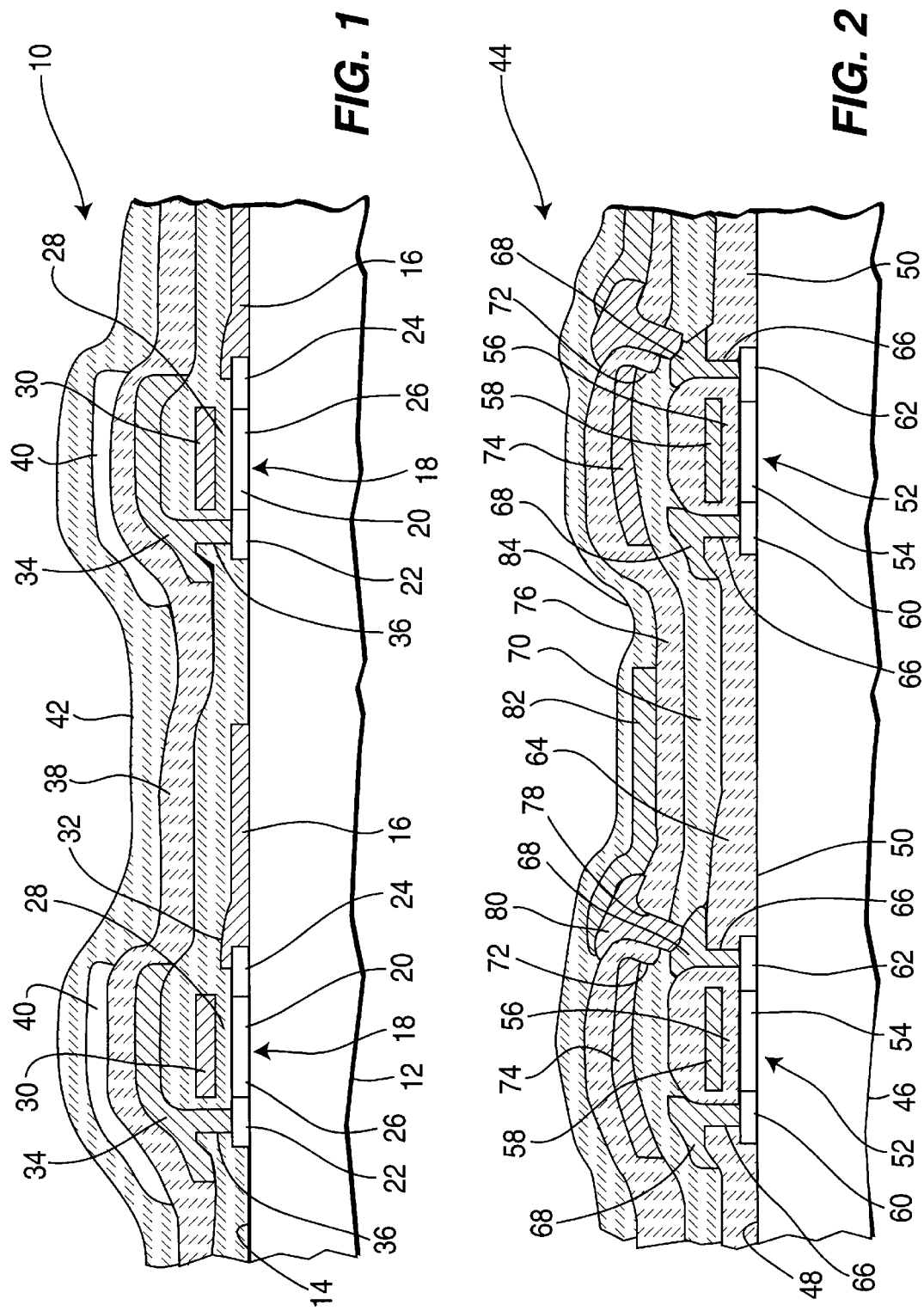

HYDROGENATION OF POLYSILICON THIN FILM TRANSISTORS

FIELD OF THE INVENTION

The present invention relates to a method of hydrogenation of polysilicon thin film transistors (TFTs), and, more particularly, to a method of hydrogenation of polysilicon TFTs in a display having a conductive contact layer which extends over the channel region of the TFTs.

BACKGROUND OF THE INVENTION

Liquid crystal displays, and similar displays, have polysilicon thin film transistors (TFTs) for operating each pixel of the display. Each TFT includes a thin layer of polysilicon with a layer of a dielectric material, such as silicon dioxide, over a portion of the polysilicon layer. A gate of a conductive material is over the dielectric layer and across a portion of the polysilicon layer, and metal contacts are provided to the polysilicon layer at each side of the gate to form the source and drain of the TFT. The gate is also generally covered with a layer of a dielectric material, such as silicon dioxide, which is generally doped with either phosphorus and/or boron. Desirably, a layer of an electrical conductor, such as indium-tin oxide (ITO) is connected to the drain of the TFT through suitable metallization. The conductive layer could cover the gate region of the TFT while it serves as the electrode for an individual pixel of the display.

Hydrogenation of the polysilicon TFTs is a known method for improving the current-voltage characteristics of the TFTs. These improvements include reducing leakage current and increasing drive current. This hydrogenation is achieved by introducing hydrogen into the polysilicon layer. Heretofore, this hydrogenation typically has been carried out before the conductive layer is applied over the TFTs. From a manufacturing point of view, it is desirable that the hydrogenation step be performed after the conductive layer is deposited and patterned. If the hydrogenation is performed prior to the deposition of the conductive layer, particularly an ITO conductive layer, the temperature at which the deposition and other subsequent depositions are carried out could cause the hydrogen to be driven out of the polysilicon layer. However, we have found that if the conductive layer is directly exposed to a hydrogenation plasma, the conductive layer may be deleteriously attacked by the hydrogen plasma.

SUMMARY OF THE INVENTION

A method of making a thin film transistor (TFT) which has a layer of polysilicon on a substrate, a conductive gate over and insulated from a portion of the polysilicon layer, conductive contacts to the polysilicon layer at at least one side of the gate, and a layer of a patterned conductive material over and insulated from the gate. The method includes the steps of providing a layer of an insulating material over the conductive layer under the conductive contact, and then introducing hydrogen into the polysilicon layer including the portion under the conductive layer through the insulating material layers.

BRIEF DESCRIPTION OF THE DRAWING

FIG. 1 is a sectional view through a portion of one form of a display which is made by the method of the present invention; and FIG. 2 is sectional view through a portion of another form of a display that is made by the method of the present invention.

DETAILED DESCRIPTION

Referring initially to FIG. 1, one form of a liquid crystal display made in accordance with the present invention is generally designated as 10. The display 10 comprises a substrate 12 of a transparent material, such as glass or quartz, having a surface 14. On the substrate surface 14 are a plurality of electrodes 16 of a transparent material. The electrodes 16 are arranged in an array of parallel rows and columns to form the pixels of the display. Adjacent and electrically connected to each electrode 16 is a thin film transistor (TFT) 18. Each TFT 18 comprises a layer 20 of polysilicon on the substrate surface 14 having spaced conductive regions 22 and 24 forming a channel region 26 therebetween. The conductive regions 22 and 24 are highly doped, either P+ or N+ type, and form the source and drain of the TFT. One of the conductive regions, such as the region 24 is connected to the electrode 16. A thin layer 28 of a dielectric material, such as silicon dioxide, is over the channel region 26, and a conductive layer 30 is over the dielectric layer 28 to form the gate of the TFT. The gate layer 30 is generally a highly conductive layer of polysilicon.

A layer 32 of an insulating material, such as silicon dioxide, is over the TFTs 18 and the electrodes 16. A layer of a conductive metal is over the insulating layer 32 and is patterned to form a plurality of conductors 34. Each conductor 34 extends through an opening 36 in the insulating layer 32 and contacts the region 22 of the TFT. The conductors also extend over the gates 30. A second layer 38 of an insulating material, such as silicon dioxide, is over the first insulating layer 32 and the conductors 34. A masking layer 40 of a light absorbing, black matrix material, such as amorphous silicon, is on the second insulating layer 38 and is patterned to extend over the TFTs 18 but not over the electrodes 16. A third layer 42 of an insulating material, such as silicon dioxide, is over the second insulating layer 38 and the masking layer 40.

The display 10 is made by forming each of the layers in succession and defining each layer to form the particular element of the display. Each layer is deposited by any well known deposition technique and is defined by masking and etching. The various layers may be formed in the following order.

1. A layer of polysilicon is deposited on the substrate surface 14 and over the electrodes 16 and defined to form the individual TFTs 18.

2. A thin layer 28 of a dielectric material is grown over the polysilicon layers and defined to extend over the polysilicon layers.

3. A layer of polysilicon is deposited over the thin dielectric layer and defined to form the gates 30. The polysilicon layer forming the gates 30 may be doped as it is being deposited or can be doped after it is deposited.

4. The polysilicon layer 20 is doped on each side of the gate 30 to form the source and drain 22 and 24 of the TFT 18.

5. A layer of a transparent conductive material is deposited on the substrate surface 14 and over the region 24 of the TFT 18, and defined to form the electrode 16.

6. The first insulating layer 32 is deposited over the TFTs 18 and the electrodes 16 and the openings 36 are formed in the insulating layer 32.

7. A layer of a conductive metal is deposited over the first insulating layer 32 and in the openings 36, and is defined to form the conductors 34.

8. The second insulating layer 38 is then deposited over the first insulating layer 32 and the conductors 34.

9. A layer of a light absorbing, black matrix material is then deposited over the second insulating layer 38 and defined to form the masking layers 40.

10. The third insulating layer 42 is then deposited over the masking layers 40 and the second insulating layer 38.

In the above described process, care must be taken after the electrode 16 is formed (step 5) that all of the following layers are deposited as temperatures low enough that the material of the electrode 16 is not adversely affected. To overcome this problem, the conductive layer forming the electrode 16 may be deposited over the insulating layer 32 and connected to the appropriate region of the TFT 18 through openings in the insulating layer 32.

After all of the various layers of the display 10 are deposited and defined, the display is then subjected to a plasma of hydrogen. We have found that the hydrogen does pass through all of the layers so as to hydrogenate the polysilicon layer 20 of the TFTs 18. However, since the various conductive layers of the display are coated with a layer of silicon dioxide, they are not adversely affected by the hydrogen plasma. Furthermore, since the hydrogenation is carried out after all of the layers of the device are deposited, the hydrogenation is not adversely affected by any high temperature operation. Thus, the method of the present invention forms a hydrogenated TFT without adversely affecting any metal layers of the device and without adversely affecting the hydrogenation of the device.

Referring now to FIG. 2, another form of a liquid crystal display which can be made by the method of the present invention is generally designated as 44. Display 44 comprises a substrate 46 of a transparent material, such as glass or quartz, having a surface 48. A plurality of spaced TFTs 52 are on the substrate surface 48. Each TFT 52 comprises a layer 54 of polysilicon having a thin layer 56 of an insulating material, such as silicon dioxide, thereover. On the dielectric layer 56 and over a portion of the polysilicon layer 56 is a layer 58 of a conductive material, such as doped polysilicon, which forms the gate of the TFT. The portions of the polysilicon layer 54 on each side of the gate 58 are doped to form the source and drain, 60 and 62 respectively, of the TFT 52.

A first layer 64 of an insulating material, such as silicon dioxide, is over the substrate surface 48, and the TFTs 52. The first insulating layer 64 has openings 66 therethrough to the source and drains 60 and 62 of the TFTs 52. Metal contacts 68 are on the first insulating layer 64 and in the openings 66 to contact the source and drains 60 and 62 of the TFTs 52. A second layer 70 of an insulating material, such as silicon dioxide, is over the first insulating layer 64 and the contacts 68. The second insulating layer 70 has openings 72 therethrough to one of the contacts 68 of each of the TFTs 52. A masking layer 74 of a light absorbing, black matrix material, such as amorphous silicon, is on the second dielectric layer 70 and extends over the TFTs 52. A third layer 76 of an insulating layer, such as silicon dioxide, is over the second insulating layer 70 and over the masking layers 74. The third insulating layer 76 has openings 78 therethrough which are aligned with the openings 72 in the second insulating layer 70. Metal contacts 80 are in the aligned openings 72 and 78 in the second and third insulating layers 70 and 76, and extend over a portion of the third insulating layer 76 around the openings 78. A layer 82 of a transparent conductive material, such as indium-tin oxide, is on the third insulating layer 76 and extends over and in contact with the metal contacts 80. The conductive layer 82 is defined to form the electrodes of the display. Also, each of the conductive layers 82 extends up to and slightly overlaps the edge of the adjacent black matrix material masking layer 74. A fourth insulating layer 84 is over the third insulating layer 76 and the conductive layers 82. If desired, the metal contacts 80 may be eliminated and the conductive material layer 82 may be deposited in the openings 72 and 78 to make direct contact to the TFT contact 68.

The display 44 is made by depositing each of the various layers in succession and defining each layer to form the particular element of the display in a manner similar to the method described above with regard to the display 10 shown in FIG. 1. Each layer is deposited by any well known deposition technique for the material of the layer. The layers are defined by the well known technique of masking and etching. After the fourth insulating layer 84 is deposited, the display 44 is subjected to a plasma of hydrogen. As with the display 10, it has been found that the hydrogen passes through all of the layers of the display 44 and hydrogenates the polysilicon layer 54 of the TFTs 52. However, since the conductive layers, such as the indium-tin oxide layer, are covered with a layer of silicon dioxide, they are not adversely affected by the hydrogen plasma. In addition, since the display 44 is hydrogenated after all of the various layers are deposited and defined, the hydrogenation is not adversely affected by any processing of the display. The display 44 has the advantage over the display 10 shown in FIG. 1 in that the fourth thin dielectric layer 84 allows much more of the applied voltage between the pixel electrodes and the top counterelectrode of the display to appear across the liquid crystal than in the form of the display shown in FIG. 1.

Thus, there is provided by the present invention a method of hydrogenating the TFTs of a liquid crystal display wherein the hydrogenation is carried out after all of the layers of the display are formed and defined and after all of the conductive layers are covered with a layer of an insulating material, such as silicon dioxide. It has been found that the hydrogen will pass through all of the layers to properly hydrogenate the polysilicon layer of the TFTs, yet the conductive layers of the display are not adversely affected by being subjected to the hydrogen plasma. In addition, since the hydrogenation is carried out after all of the layers of the device are deposited and defined, the hydrogenation is not adversely affected by any processing steps.

What is claimed is:

1. A method of making a thin film transistor having a layer of a polysilicon on a surface of a substrate, a conductive gate over a portion of the polysilicon layer and insulated therefrom by a layer of an insulating material, a conductive contact to the polysilicon layer at at least one side of the gate, and a layer of a patterned conductive material extending over and insulated from the gate comprising the steps of:

providing a layer of an insulating material over the conductive material layer and the conductive contact; and incorporating hydrogen into the polysilicon layer including the portion under the conductive layer, through the insulating layers.

2. The method of claim 1 wherein a layer of insulating material is deposited over the gate, a layer of indium-tin oxide is formed on the insulating layer, another layer of an insulating material is formed over the indium-tin oxide layer, and the hydrogen passes through the insulating layers and into the polysilicon layer.

3. The method of claim 1 wherein the hydrogen is incorporated by subjecting the device to a plasma of hydrogen.

4. A method of making a liquid crystal display comprising the steps of:

forming an area of polysilicon on a substrate surface;

forming a gate of a conductive material over and insulated from a portion of the polysilicon layer;

depositing a first layer of an insulating material over the gate;

forming a conductive contact through an opening in the first insulating layer to a portion of the polysilicon layer at one side of the gate;

forming a patterned conductive layer over the first insulating layer and over the gate;

forming another layer of an insulating material over the conductive layer and the conductive contact; and then diffusing hydrogen through the insulating layers and into the polysilicon layer including the portion of the polysilicon layer under the conductive layer.

5. The method of claim 4 in which the hydrogen is diffused by subjecting the device to a plasma containing hydrogen.

6. The method of claim 4 in which the conductive layer is formed to contact the conductive contact.

7. The method of claim 6 in which the conductive layer extends over and is insulated from the gate.

8. The method of claim 7 further comprising forming a layer of a black matrix material over and insulated from the portion of the conductive layer which is over the gate, and forming a layer of an insulating material over the black matrix layer.

9. The method of claim 8 further comprising forming at least one electrode of a transparent conductive material on the surface of the substrate and in contact with the polysilicon layer.

10. The method of claim 4 in which the conductive layer is formed of indium-tin oxide.

11. The method of claim 4 further comprising forming a layer of a black matrix material over the second insulating material and over the gate, forming a third layer of an insulating material over the second insulating layer and the black matrix material, forming the conductive layer over the third insulating layer, and forming the other insulating layer over the second insulating layer and the conductive layer.

12. The method of claim 11 further comprising forming a contact in the aligned openings in the second and third insulating layers to a portion of the conductive contact and forming the conductive layer over and in contact with the contact.

13. The method of claim 12 further comprising forming the conductive layer at least up to the edge of the black matrix layer.

* * * * *